United States Patent [19]

Champagne et al.

[11] Patent Number: 5,333,316
[45] Date of Patent: Jul. 26, 1994

[54] LOCKING AND ROW BY ROW MODIFICATION OF A DATABASE STORED IN A SINGLE MASTER TABLE AND MULTIPLE VIRTUAL TABLES OF A PLURALITY OF CONCURRENT USERS

[75] Inventors: Steven R. Champagne, Poughkeepsie; Gary J. Nagelhout, Wappingers Falls, both of N.Y.; Peggy C. Zych, Seven Hills, Ohio

[73] Assignee: International Business Machines Corporation, Armonk, N.Y.

[21] Appl. No.: 746,398

[22] Filed: Aug. 16, 1991

[51] Int. Cl.⁵ ............................................. G06F 15/40
[52] U.S. Cl. ..................................... 395/600; 345/425; 364/974.4; 364/974.7; 364/282.4; 364/283.4; 364/DIG. 1
[58] Field of Search ................ 395/600, 425; 364/300, 364/200, 900

[56] References Cited

U.S. PATENT DOCUMENTS

| | | | |
|---|---|---|---|
| 4,432,057 | 2/1984 | Darriell et al. | 364/300 |
| 4,611,298 | 9/1986 | Schuldt | 395/600 |
| 4,627,019 | 12/1986 | Ng | 395/485 |
| 4,631,673 | 12/1986 | Haas et al. | 364/300 |
| 4,646,229 | 2/1987 | Boyce | 395/600 |
| 4,823,310 | 4/1989 | Grand | 395/600 |
| 4,881,166 | 11/1989 | Thompson et al. | 395/600 |
| 5,006,978 | 4/1991 | Neches | 395/650 |
| 5,220,657 | 6/1993 | Bly et al. | 395/425 |

FOREIGN PATENT DOCUMENTS

04454610A2  10/1991  European Pat. Off. .

OTHER PUBLICATIONS

Bernstein et al. "Analyzing Concurrency Control Algorithms When User and System Operations Differ" *IEEE Trans. on Software Eng.*, vol. SE-9, No. 3, May 1983.

Korth & Silberschatz, *Database System Concepts,* McGraw-Hill, (New York, 1986) pp. 380-391, 403-435, 440-447.

"Delaying of On-Line Message Display" IBM Technical Disclosure Bulletin, vol. 28, No. 1, pp. 87-88 (Jun. 1985).

"Use of Virtual Tables for Data Sharing" IBM Technical Disclosure Bulletin, vol. 29, No. 8, p. 3723 (Jan. 1987).

I. Widya, et al. "Concurrency Control in a VLSI Design Database" 25th ACM/IEEE Design Automation Conference, pp. 357-362 (1988).

IBM Technical Disclosure Bulletin, vol. 26, No. 6, Nov. 1983, pp. 2966-2969, "Conditional Read/Write Sharing Mechanism".

ACM Transactions on Database Systems, vol. 6, No. 2, Jun. 1991, pp. 213-226, "On Optimistic Methods for Concurrency Control".

IBM Technical Disclosure Bulletin, vol. 33, No. 9, Feb. 1991, pp. 466-471 "Implementation of an Optimistic Lock Mechanism for Persistent Objects Within an Object-Oriented Environment".

*Primary Examiner*—Thomas C. Lee
*Assistant Examiner*—Paul R. Lintz
*Attorney, Agent, or Firm*—Charles W. Peterson, Jr.

[57] ABSTRACT

A database management system for use in designing integrated circuit chips. A large number of designers and users are given concurrent access to design data stored in a Master Table by providing each designer with a private copy of the Master Table called the designer's Virtual Table. Each designer can independently alter data displayed from the designer's Virtual Table without interfering with other designers. Whenever a designer alters the displayed data, the displayed row containing the altered data is written to the Master Table and the designer's Virtual Table, provided that the Master Table row's time-date stamp matches the corresponding Virtual Table row's time-date stamp. If the time-date stamps do not match, then the Master Table row is copied into the Virtual Table, the designer receives an error message, and the designer is allowed to update the corrected row.

16 Claims, 3 Drawing Sheets

```
------------------- BOOK TABLE ---     450 LINES DISPLAYED
.CMD === >                              SCROLL ===>HALF
HELP: PF1  LINE CMDS: A,B,C,D,F,G,H,I,L,M,P,Q,S,T,U,V,X   VIEW 11 OF 43
MS-123                                                    TEST MODE
 BTR  HC   PEUR   FUNTION                    FLY_VERS | DATESTMP|TIMESTMP|USERSTMP
```

| BTR | HC | PEUR | FUNTION | | FLY_VERS | DATESTMP | TIMESTMP | USERSTMP |
|-----|----|----|---------|---|----------|----------|----------|----------|
| 54 | 54 | 54 | 54 | | 54 | 56 | 58 | 60 |
| W210 | A | W3Y | WJ4 (B825G) | W/NODES | 1 | 910523 | 150757 | SAMMY |
| W211 | A | W3W | WRB (B900B) | (RLF LOOP) | 6 | 901116 | 111902 | CHESTER |
| W211 | B | W3X | WRD (B900D) | (RLF LOOP) | 7 | 910522 | 140237 | SAMY |
| W212 | A | W77 | WRG (B901B) | (RLF LOOP) | 8 | 901116 | 111903 | CHESTER |
| W217 | A | W78 | WUS (B600D) | (RLF LOOP) | 6 | 901116 | 111903 | CHESTER |
| W217 | B | W6A | WUS (B600D) | (DC EXPT) | 13 | 901116 | 111903 | CHESTER |
| W219 | A | W4F | DR/TER VOLT/CIP BUS MONI | | 3 | 901116 | 111903 | CHESTER |
| W220 | A | W4G | DIFF. I/P PP DR FOR YMTS | | 1 | 901116 | 111903 | CHESTER |
| W221 | A | W4H | EMBEDDED ARRAY FOR YMTS | | 1 | 900713 | 105157 | SCHELLY |
| W222 | A | W4J | INT CELL VOLT BUS MONITOR | | 2 | 901116 | 105724 | CHESTER |
| W223 | A | W4K | WCA RLF LOOP FROM YMTS | | 3 | 901116 | 105724 | CHESTER |
| W224 | A | W4L | WRV (B903B) | (RLF LOOP) | 0 | 901116 | 111903 | CHESTER |
| W224 | B | W4M | WRX (B903D) | (RLF LOOP) | 9 | 901116 | 111903 | CHESTER |
| W224 | D | W72 | WS4 (B903P) | (RLF LOOP) | 11 | 910522 | 133042 | SAMMY |
| W224 | E | W73 | WS8 (B903R) | (RLF LOOP) | 15 | 910102 | 125931 | GARY |
| W224 | F | W6F | WRV (B903B) | (DC EXPT ) | 5 | 901116 | 111903 | CHESTER |
| W224 | G | W6G | WRX (B903D) | (DX EXPT ) | 6 | 901116 | 111903 | CHESTER |
| W224 | I | W5S | WS4 (B903P) | (DC EXPT ) | 11 | 901116 | 111903 | CHESTER |
| W225 | A | W79 | WTB (B915B) | (RLF LOOP) | 10 | 901116 | 111903 | CHESTER |
| 54 | 54 | 54 | 54 | | 54 | 56 | 58 | 60 |
| 54 | 54 | 54 | 54 | | 54 | 56 | 58 | 60 |
| 54 | 54 | 54 | 54 | | 54 | 56 | 58 | 60 |
| 54 | 54 | 54 | 54 | | 54 | 56 | 58 | 60 |
| 54 | 54 | 54 | 54 | | 54 | 56 | 58 | 60 |

FIG. 1

LOCKING AND ROW BY ROW MODIFICATION OF A DATABASE STORED IN A SINGLE MASTER TABLE AND MULTIPLE VIRTUAL TABLES OF A PLURALITY OF CONCURRENT USERS

FIELD OF THE INVENTION

This invention relates to database management systems and, more particularly to multi-user database systems which allow concurrent access to a relational database by an arbitrary number of database users.

BACKGROUND OF THE INVENTION

Collections of data called databases are well known. Computer systems which can be used by multiple users are also well known. When more than one user on a multi-user system attempts to access a database, problems may arise. If one user is reading from the database, while another user is writing to the database, the data integrity of the data read by the first user is suspect. If two users are attempting to write data to the database, what is actually written is unpredictable and so data integrity is suspect. To minimize these and other data integrity problems, locking schemes were implemented, whereby only one user at a time was allowed to access the database.

Locking a database meant that, whenever a user was reading from or writing to the database, only that user was allowed to access that database, while all other users were locked out. Thus, the problem of one user writing data to a database while another prior user is reading the same data from the database was eliminated. The problem of two users simultaneously writing to a database was also eliminated.

However, locking still did not solve all data integrity problems. For example: User one reads from a database; User two writes data into the same database; and then, user one writes data back into the database. User one may have overwritten the data which user two had written into the database without either user knowing that the data had been altered by the other.

In addition to data integrity problems, locking created system bottlenecks which severely impacted overall system performance, even in a small system with a small number of users. A single user could monopolize a database by gaining access and holding it locked. Other users were forced to wait for access until that first single user released the lock on the database. After the first user released the lock, a second user was free to gain access to the database and monopolize it just as the first user had. That time spent idly waiting was unproductive, wasted and, therefore, impaired system performance. For a larger system with a large number of users attempting to access the same database, the effective result was the same regardless of whether a single user was monopolizing the database. That was because even if no single user attempted to monopolize a single database, the aggregate time spent by all of the users attempting to access the database meant that each user spent a significant amount of time idly waiting for a turn in accessing the database.

In order to address this locking problem and to improve multi-user system performance by reducing the amount of time each user spent waiting for the same database, locks were distinguished based on the type of user access to the database. Thus locks were distinguished as read locks or write locks. A user having a read lock merely prevented another user from writing to the database, while allowing other users to obtain read locks and, concurrently, to read from the same database. A user having a write lock excluded all access by other users until the user having the write lock released the write lock. A system having read locks and write locks to achieve concurrency is also known as "several readers and one writer" system.

This "several readers and one writer" system was inefficient for database applications wherein many users use the same data and, therefore, each user maintains a private copy of the database. One way in which the "many readers and one writer" system was inefficient was that building such a database was slow because only one user at a time could write data to the database in order to update the database. First data was written by the user to the user's private copy. Next, the user transferred the updated private copy to a central master copy of the database. Then the updating user notified every other user of the update. Finally, each user copied the updated master copy into the user's private copy. The next user, wishing to update the database, repeated the steps taken by the previous user in updating the database. A user writing to the database was given a write lock which precluded other users from even reading the database during the write.

When a database is organized as a table, often each database user maintains a private copy. Databases organized as tables and called relations are described in C.F. Date, *An Introduction to Database Systems*, 4th edition; Addison-Wesley, 1986. A relation has rows called tuples and columns. Each column has a unique name called the column's attribute. Each element in a tuple (or row) is called an item. Each item is identified by the attribute for the column in which it resides. If each tuple has an item or group of items which uniquely identify it, e.g., a row number, then the identifying item(s) is (are) called the tuple's key. If the key is a group of items, then the group is called a composite. Typically, whenever any user modified a private copy of a table, that user had to notify other users that the table was modified, and then send a copy of the altered database to each user. Consequently, each user was then required to update the private copy and, possibly to re-execute calculations or instructions that the user had already executed on the data in the prior copy. Because, very often, each user was only interested in a small subset of the data in an entire table, alterations made to a part of the table by one user might not affect most of the other users. However, regardless of whether alterations to a table affected a user's area of interest, every user holding a private copy was required to update it. Thus, it was more likely than not that the majority of users were unnecessarily forced to update a private copy which wasted valuable computer time and resources. Furthermore, this waste was geometrically proportional to the size of the table and the number of concurrent users. This geometric increase results because every user is required to store a large table each time even a single item in one of the private copies is altered.

Also, as the number of users and the size of the table increase, it is increasingly likely that alterations to the table made by one user would not affect every other concurrent user. Since for a very large database, each user, very likely, is using only a portion of the table, other concurrent users, very likely, also were using different portions which would not include an altered portion. Thus, forcing every user to update or store an updated private copy of a large table regardless of whether the user is affected by the update wasted a significant amount of computer time and resources.

These problems are especially acute in designing highly complex, dense, integrated circuit chips wherein hundreds of designers (users) require concurrent access to design data stored in a single table. Allowing a single user to lock the table during a write delayed all of the other users. Further initially creating the table was slow because, although each of the hundreds of users could create part of the data simultaneously, e.g., one row, only one user at a time could store the data created. Data was stored in the table by copying the table, altering the copy and then storing the altered copy. So, to store data from hundreds of users, the table had to be copied, altered and stored hundreds of times. Each user had to wait for a turn to update the table. Sequentially storing data in the table was both inefficient and time consuming. It was also inefficient to prevent users from reading data which may remain unaltered even after the table is updated.

OBJECTS OF THE INVENTION

It is an object of this invention to reduce integrated circuit chip design time.

It is another object of this invention to improve relational database management.

It is still another object of this invention to reduce waste of valuable computer time and resources.

It is still another object of this invention to improve database system performance.

It is still another object of this invention to improve relational database integrity for concurrently used multi-user databases.

It is still another object of this invention to minimize relational database locking by a single user.

It is still another object of this invention to reduce interference among concurrent relational database users.

It is still another object of this invention to increase relational database availability for concurrent use by more concurrent users.

It is still another object of this invention t increase the number of users that may concurrently use a relational database in a multi-user database system.

It is still another object of this invention to increase the number of designers that may concurrently work on the same integrated circuit chip design.

It is still another object of this invention to improve relational database management, database system performance, and relational database integrity.

It is still another object of this invention to increase the number of users that may concurrently use a relational database, while reducing interference to database use.

It is still another object of this invention to improve relational database integrity, system performance and management, while increasing relational database availability for use by a larger number of concurrent users in a multi-user database system.

It is still another object of this invention to reduce integrated circuit chip design time while increasing the number of chip designers that may concurrently work on designing the same integrated circuit chip and reducing interference between chip designers.

SUMMARY OF THE INVENTION

In accordance with the objects of this invention a relational database system for use in designing integrated circuit chips is provided, which allows concurrent use of large tabular databases by a large number of designers and other users.

A single master copy of a large table is stored and maintained. The table has a plurality of rows and columns. Each row has a time-date stamp in three columns which contains the time and date of the last modification to any of the items in the row and the identification of the user that made that modification. Each table user is given a private copy of the table called the user's virtual copy. To alter or update the master copy, a user first alters a display of a portion of the virtual copy and then attempts to store the altered display row into the master copy. If the time-date stamp for the Master Table row does not match the time-date stamp for the corresponding row in the altering user's virtual copy, then, the Virtual Table row is updated from the Master Table row and the user is notified that the attempt to update the Master Table was unsuccessful. Otherwise, if the time-date stamp in the Master Table row matches the time-date stamp for the corresponding row in the user's Virtual Table, then the time-date stamp is updated and the altered data is transferred from the display to the Virtual Table and to the Master Table.

BRIEF DESCRIPTION OF THE DRAWINGS

While the specification concludes with claims particularly pointing out and distinctly claiming that which is regarded as the present invention, details of the preferred embodiment of the present invention may be more readily ascertained from the following when read in conjunction with the following drawings wherein:

FIG. 1 is an example of a computer display of a portion of a TIME managed database.

TECHNICAL DESCRIPTION OF THE PREFERRED EMBODIMENT

Figure 2:
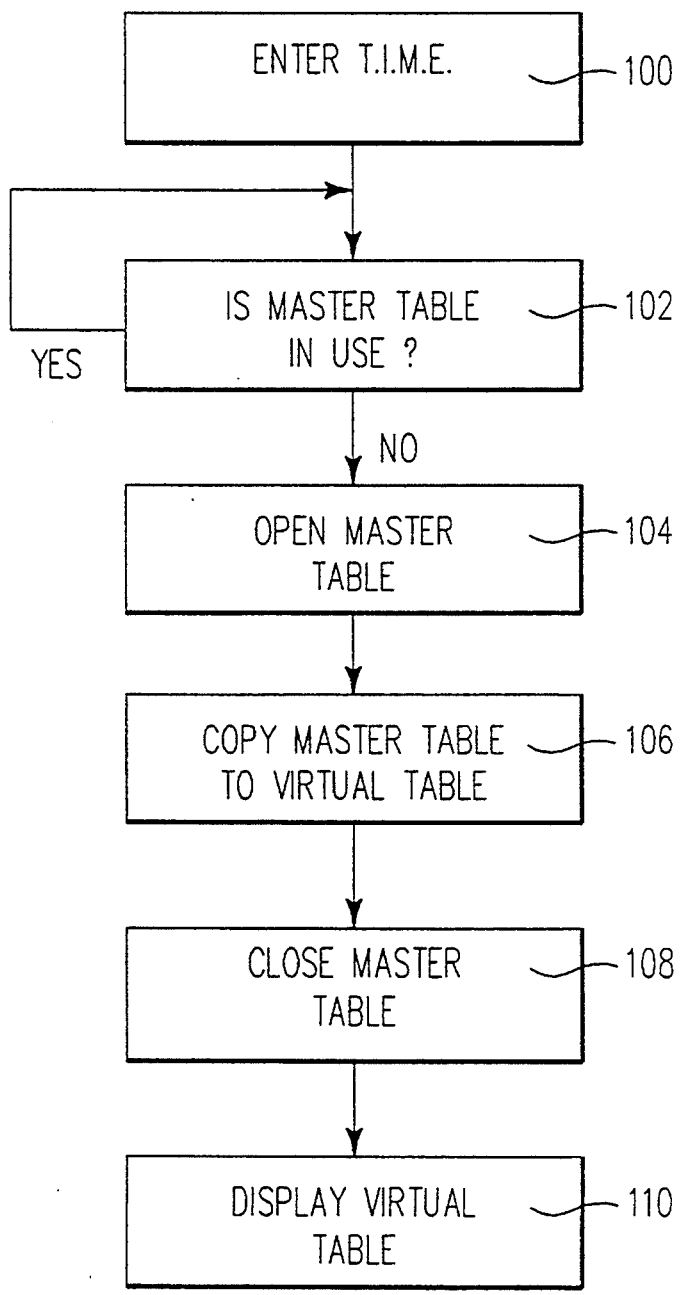
FIG. 2 is a flow diagram of how a user enters the relational database management system of the present invention.

The preferred embodiment of the present invention is a Relational Database management method and system for use in design of integrated circuit chips and is called the "Technology Information Management Enhancer" or TIME. TIME is intended for any general purpose computer capable of multiprocessing and concurrent data access by multiple user's. However, the preferred computer is the IBM System 390 operating under the Multiple Virtual Storage (MVS) operating system. A user refers generally to any person, processor, or program being executed by a processor, capable of using data stored in a database. The above list is not intended to be an exclusive list of users, but merely to be an illustrative list of potential TIME users.

FIG. 1 is an example of a computer display of a portion of a TIME managed Table 50. A row 52 of the relational database (table) 50 of the preferred method and system has 100 items 54 as data fields and 3 items 56, 58 and 60 called the row's "time-date stamp", which contain the date 56 and time 58 of the last modification and the identification 60 of the user that made that modification. Whenever a change is made to one of a row's data field items, the row's time-date stamp is updated with the time and date of the change and identification of the user making the change. Although, a row of the preferred table organization is 103 items, it is contemplated that the number of items in a row may be varied without significantly departing from the spirit of the invention. In particular the number of items provided as data fields may be much more or much less than 100. Also, the time, date and identification items or fields may be mixed, combined or further distinguished without departing from the spirit of the invention.

Each user to a TIME managed database holds and maintains a copy of the database. The copy is called the user's Virtual Table. TIME also maintains one master copy of the database called the Master Table. TIME has a single lock for the Master Table which is sequentially granted to users for updating or for reading the Master Table. When the lock is granted to a user, all other users are locked out of the Master Table and the Master Table is said to be in use. However, since each user has a Virtual Table, locking the Master Table only interferes with users attempting to access, i.e., trying to read from or write to, the Master Table. FIG. 2 is a flow diagram of how a user enters TIME 100 and thus creates a Virtual Table.

Upon entering TIME, i.e., to obtain a virtual copy of a TIME managed relational database, TIME checks to determine if any user has a lock on the Master Table 102. Another user may have a lock on the Master Table either because the user is updating data in the table or, because the user is copying the Master Table into the user's Virtual Table. If the Master Table is in use (locked), then the user attempting to enter TIME must wait until it is no longer in use. If the Master Table is not in use or, once the Master Table is no longer in use, the user is given a lock on the Master Table. Once the user has the lock, the user "opens" the Master Table 104. "Opening the Master Table" 104 means that the user can read from or write to the Master Table. Next, the user creates an empty virtual table in the user's memory space with each column having the same attributes as corresponding columns in the Master Table and then, the user copies the Master Table into the empty virtual table 106. After copying the Master Table 106, the user releases the lock on the Master Table 108. Thus, the user has a complete current copy of the Master Table in the user's Virtual Table. Finally, the Virtual Table is displayed for the user 110. In the preferred embodiment, the Virtual Table is displayed 110 at a computer terminal. However, use of the term display is meant to be illustrative and not restrictive and it is contemplated that "display" includes storage of a portion of the Virtual Table in a display buffer, in working registers or, any form of display suitable to the Virtual Table user is within the spirit and scope of the invention.

Figure 3:
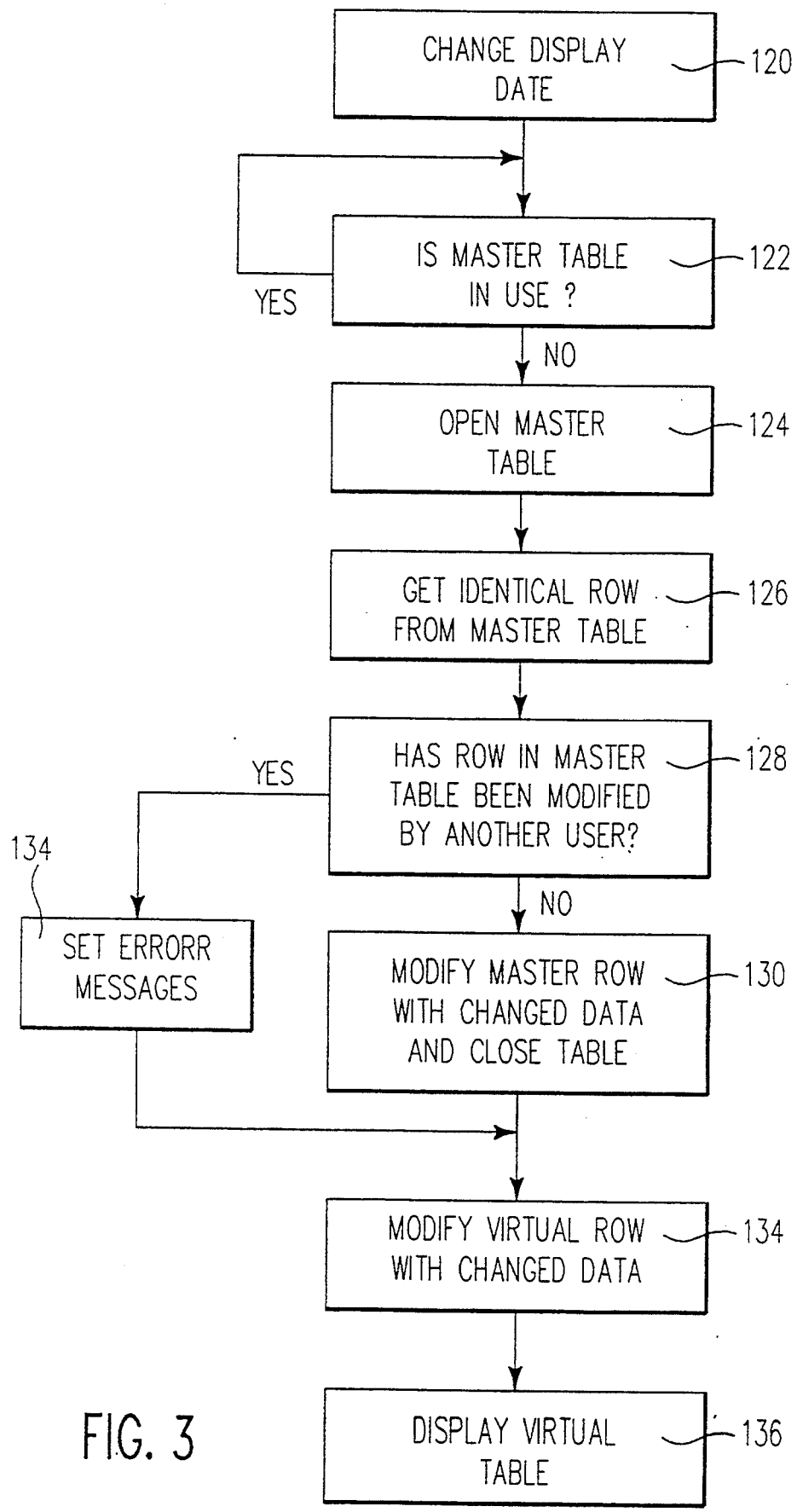
FIG. 3 is a flow diagram of how a user updates a database managed by the relational database management system of the present invention.

Once the Virtual Table is displayed 110, the user has complete uninterrupted use of the Virtual Table. The user is free to read from or write to the Virtual Table without interfering with other users and without interference from other users. All alterations are first made to displayed data and then, if data integrity would not be affected, transferred to the Master Table. Alterations made to the Master Table by a user are reflected in the user's Virtual Table. However, a user's Virtual Table is not updated as the result of another user altering the Master Table until the time-date stamp for the row of the Master Table intended for alteration does not match the time-date stamp for the corresponding row in the updating user's Virtual Table. If the time-date stamps match then the time-date stamp is updated in both rows and the alterations are then transferred from the displayed data to the Master Table row and the updating user's Virtual Table. Otherwise, the updating user is notified that the row has been altered; the row is updated in the user's Virtual Table, and the user is allowed to alter the updated row. See FIG. 3 for a flow diagram of how the Master Table and the updating user's Virtual Table are updated.

When a user alters the displayed data 120, TIME checks to determine if the Master Table is locked 122. If the Master Table is locked, then TIME waits until the lock is released. Once the lock is released or, if the Master Table is not in use, then TIME opens the Master Table 124. Next, TIME selects the row in the Master Table which contains the altered data 126. The time-date stamp for the selected row is compared against the time-date stamp for the corresponding row in the user's Virtual Table 128. If the two time-date stamps match, then the selected row has not been altered since the user last copied it, i.e. the user's Virtual Table copy of the row was current and correct. If the time-date stamps match, then TIME alters the selected Master Table row with the changes from the altered display data, modifies the Master Table row's time-date stamp, and closes the Master Table 130. After closing the Master Table 130, TIME modifies the corresponding row in the user's Virtual Table to accurately reflect the updated row in the Master Table 134 and displays the updated Virtual Table 136.

However, if, TIME compares the two time-date stamps 128, and they do not match, then another prior user had already altered the selected Master Table row and the corresponding Virtual Table row is stale. The data integrity problems described above would occur by allowing a user to update a Master Table row while ignoring updates to the same row by a prior user. So, if the time/date stamps do not match 128 TIME sends the updating user an error message 132 which indicates that another user had modified some of the data in the selected row. Instead of updating the Master Table row 130, the Master Table row is copied into the Virtual Table 134 and the corrected Virtual Table is displayed 136. The error message 132 also notifies the user that the row was not updated with the user's intended alterations. If the user still wishes to alter the row, then the user must re-alter the corrected row and update the Master Table as provided above.

Thus the TIME system reduces wasted computer resources and time by supplying each user with an individual copy of a Table which is updated only if the update affects the user and only for the portion of the Table affecting the user.

Although the preferred embodiment of the present invention is herein described, variations and modifications thereof will occur to those skilled in the art. Therefore, it is intended that the appended claims shall be construed to include the preferred embodiment and all such variations and modifications in form and detail that fall within the spirit and scope of the invention.

We claim:

1. A relational database system for managing a relational database concurrently-used by a plurality of users comprising:

means for maintaining a master copy of at least one said relational database in a Master Table;

locking means for locking said Master Table when one said user is accessing said Master Table;

means for creating a Virtual Table for each of a plurality of concurrent said users;

means for selecting a single row, containing a plurality of data fields, from a plurality of rows in said Master Table;

means for indicating currency in said single row;

means for comparing said indicated currency of said selected row with a corresponding row in one of said concurrent user's Virtual Table;

means for modifying said selected single row; and, means, in response to an output signal from said comparing means, for replacing said selected row in said Master Table with said modified selected row and for copying said modified selected row into said corresponding row in said one of said concurrent user's Virtual Table.

2. The system of claim 1 further comprising means for displaying each of said concurrent user's Virtual Table.

3. The system of claim 1 further comprising means for informing said one user that said corresponding row is stale.

4. The system of claim 1 further comprising means for displaying each of said user's Virtual Table.

5. The system of claim 4 further comprising means for determining if the Master Table is locked.

6. A relational database for concurrently designing integrated circuit chips by a plurality of users of a circuit Design Table comprising:

means for maintaining a copy of at least one said Design Table, said copy being a Master Table;

locking means for locking said Master Table when one said user is accessing said Master Table;

means for determining if said Master Table is locked;

means for creating a Virtual Table for each of said users;

means for displaying said Virtual Table;

means for selecting a single row from a plurality of rows in said Master Table, wherein each said row comprises a plurality of data fields and a means for indicating currency;

means for comparing said indicated currency of said selected row with a corresponding row in one of said users' Virtual Table;

means for modifying said selected row; and means, in response to an output signal from said comparing means, for replacing said selected row in said Master Table with said modified selected row and for copying said modified selected row into said corresponding row in said one of said concurrent user's Virtual Table.

7. The system of claim 11 further comprising means for informing said one user that said corresponding row is stale.

8. A computer implemented method of managing a relational database for concurrent use by a plurality of users, said computer implemented method comprising the steps of:

a) copying said relational database into a Master Table;

b) copying Master Table into a Virtual Table for each of said concurrent users;

c) locking said Master Table when one said concurrent user is accessing said Master Table;

d) retrieving a selected row from said Master Table whenever said one said concurrent users attempts to alter an item in said retrieved row and retrieving a corresponding row from said altering user's Virtual Table;

e) altering said selected row in said Master Table whenever said selected row from said Master Table and said retrieved row from said altering user's Virtual Table are identical; and f) copying said altered selected row from said Master Table into said retrieved row of said altering user's Virtual Table.

9. The method of claim 8 further comprising the step of checking to determine if said Master Table is in use.

10. The method of claim 8 further comprising the step of displaying said Virtual Table for each of said concurrent users.

11. The method of claim 8 wherein the altering step further comprises notifying said altering user whenever said retrieved rows differ.

12. The method of claim 8 wherein said copying step further comprises individually making each of said concurrent users' Virtual Table.

13. A computer implemented method of managing a relational database for concurrent use by a plurality of users, said method comprising the steps a) copying said relational database into a Master Table, said Master Table comprised of a plurality of rows;

b) copying said Master Table into a Virtual Table for each of said concurrent users;

c) displaying said Virtual Table for each of said users;

d) checking said Master Table for a lock whenever one of said concurrent users' attempts to alter an item in one of said rows;

e) locking said Master Table;

f) retrieving said one row from said Master Table and a corresponding row from said altering users' Virtual Table;

g) altering said retrieved row in said Master Table when said retrieved row from said Master Table and said corresponding row from said altering user' Virtual Table are identical, otherwise notifying said altering user of an error condition;

h) copying said altered retrieved row from said Master Table into said corresponding row of altering users' Virtual Table; and, 14. The method of claim 13 wherein the step b of copying the Master Table into a Virtual Table comprises the steps of:

a) checking said Master Table for a lock;

b) locking said Master Table;

c) creating a Virtual Table and copying said Master Table into said Virtual Table for said user; and, d) closing said Master Table.

15. A computer implemented method of integrated circuit chip design for designing an integrated circuit chip by a plurality of designers comprising the steps of:

a) creating a Master Table of design data;

b) providing each of said designers with a copy of said Master Table, each of said designers' copy being maintained as a Virtual Table;

c) displaying each of said designers' Virtual Table;

d) updating at least one item by one of said designers;

e) checking said Master Table for a lock;

f) locking all of said designers except for said updating designer out of said Master Table;

g) retrieving a row from said Master Table, said retrieved row containing said one item, and retrieving a corresponding row from said updating designer's Virtual Table;

h) comparing said retrieved row from said Master Table and said retrieved corresponding row from said updating desinged's Virtual Table;

i) updating said item in said Master Table and in said updating user's Virtual Table if both said retrieved rows from said Master Table and said updating desinger's Virtual Table are identical, otherwise, copying said retrieved row from said Master Table into said corresponding row of said updating designer's Virtual Table and notifying said updating designer; and, j) unlocking said Master Table.

16. The method of claim 15 wherein the step b of providing each of said designers with Virtual Table comprises the steps of:
   a) checking said Master Table for a lock;
   b) locking said Master Table for one of said designers;
   c) creating a Virtual Table and copying said Master Table into said Virtual Table for said one designer; and,
   d) unlocking and closing said Master Table.

* * * * *